(12) United States Patent
Kim et al.

(10) Patent No.: US 12,519,052 B2
(45) Date of Patent: Jan. 6, 2026

(54) ELECTRONIC DEVICES AND METHODS OF MANUFACTURING ELECTRONIC DEVICES

(71) Applicant: Amkor Technology Singapore Holding Pte. Ltd., Singapore (SG)

(72) Inventors: Soo Hyun Kim, Incheon (KR); Won Myoung Ki, Incheon (KR); Dong Hoon Han, Seoul (KR); Tae Kyeong Hwang, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 589 days.

(21) Appl. No.: 17/976,094

(22) Filed: Oct. 28, 2022

(65) Prior Publication Data

US 2024/0145369 A1 May 2, 2024

(51) Int. Cl.
*H01L 23/48* (2006.01)
*H01L 21/56* (2006.01)
*H01L 23/31* (2006.01)
*H01L 23/498* (2006.01)
*H01L 23/552* (2006.01)
*H01L 23/00* (2006.01)

(52) U.S. Cl.
CPC ........ *H01L 23/49838* (2013.01); *H01L 21/56* (2013.01); *H01L 23/3128* (2013.01); *H01L 23/49822* (2013.01); *H01L 23/552* (2013.01); *H01L 24/13* (2013.01); *H01L 24/16* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/16238* (2013.01); *H01L 2924/0132* (2013.01); *H01L 2924/0133* (2013.01); *H01L 2924/014* (2013.01)

(58) Field of Classification Search
None
See application file for complete search history.

(56) References Cited

U.S. PATENT DOCUMENTS

| | | | |
|---|---|---|---|
| 7,342,303 B1 | 3/2008 | Berry et al. | |
| 8,350,367 B2 * | 1/2013 | Chiu | H01L 23/552 257/659 |
| 8,508,023 B1 * | 8/2013 | Kelly | H01L 24/97 257/659 |
| 8,829,667 B2 | 9/2014 | Park et al. | |

(Continued)

*Primary Examiner* — Nicholas J Tobergte
(74) *Attorney, Agent, or Firm* — Spectrum IP Law Group LLC

(57) ABSTRACT

In one example, an electronic device comprises a substrate comprising a conductive structure and a dielectric structure, the dielectric structure comprising an upper dielectric layer, an electronic component over a top side of the substrate and coupled with the conductive structure, an encapsulant over the top side of the substrate and adjacent a lateral side of the electronic component, and a shield over the top side of the electronic component and contacting a lateral side of the encapsulant and a first lateral side of the substrate. The conductive structure comprises a first tab structure at the first lateral side of the substrate, and wherein the first tab structure contacts the shield and extends above the upper dielectric layer. Other examples and related methods are also disclosed herein.

20 Claims, 12 Drawing Sheets

(56) References Cited

U.S. PATENT DOCUMENTS

| | | |
|---|---|---|
| 10,643,952 B2 | 5/2020 | Pagaila et al. |
| 2018/0294233 A1* | 10/2018 | Yoon .................. H01L 23/3114 |
| 2020/0312782 A1 | 10/2020 | Eid et al. |

* cited by examiner

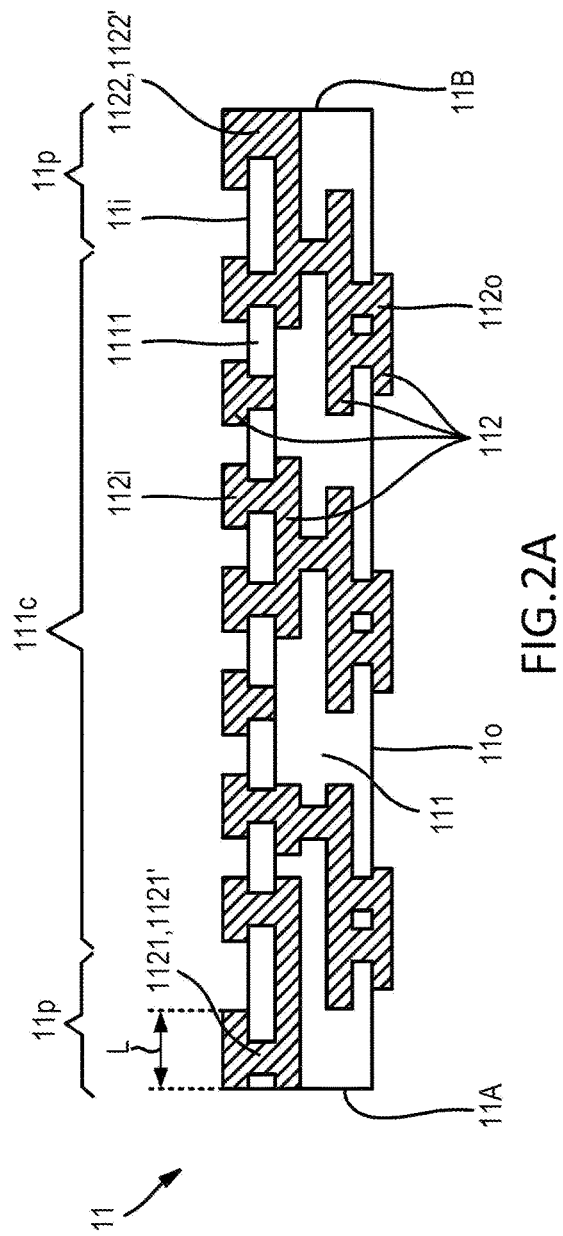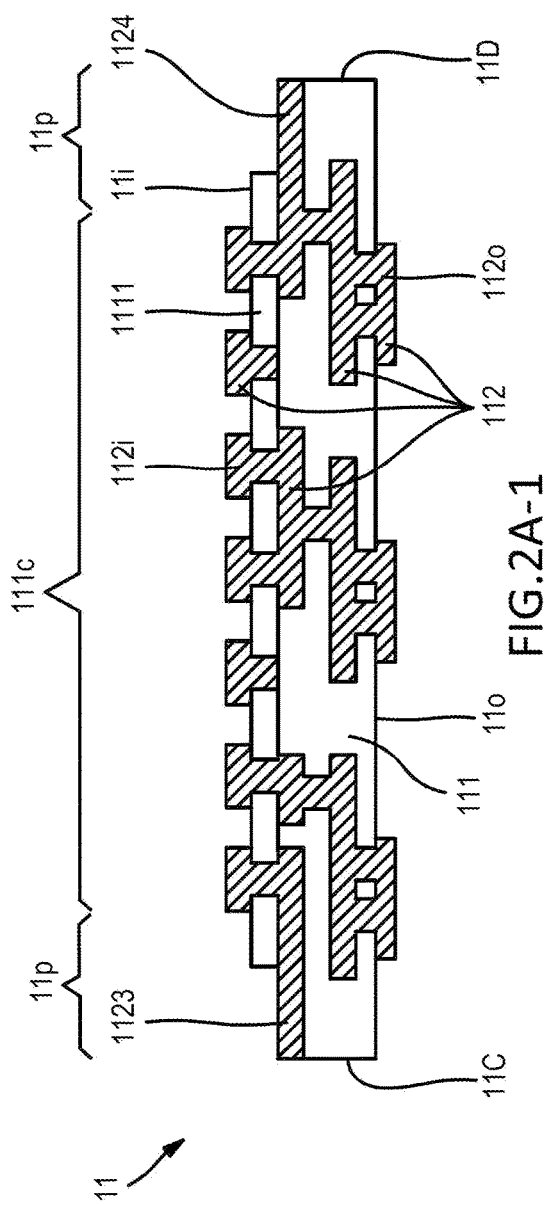

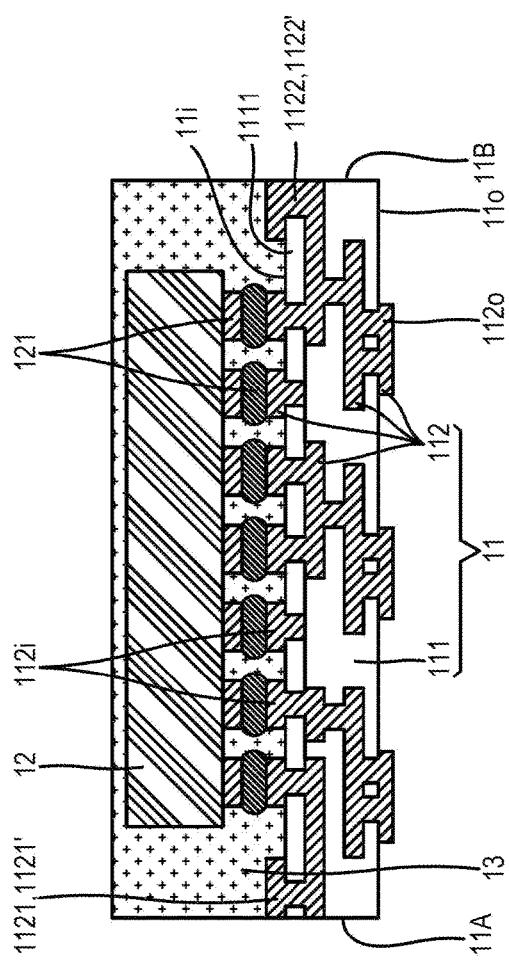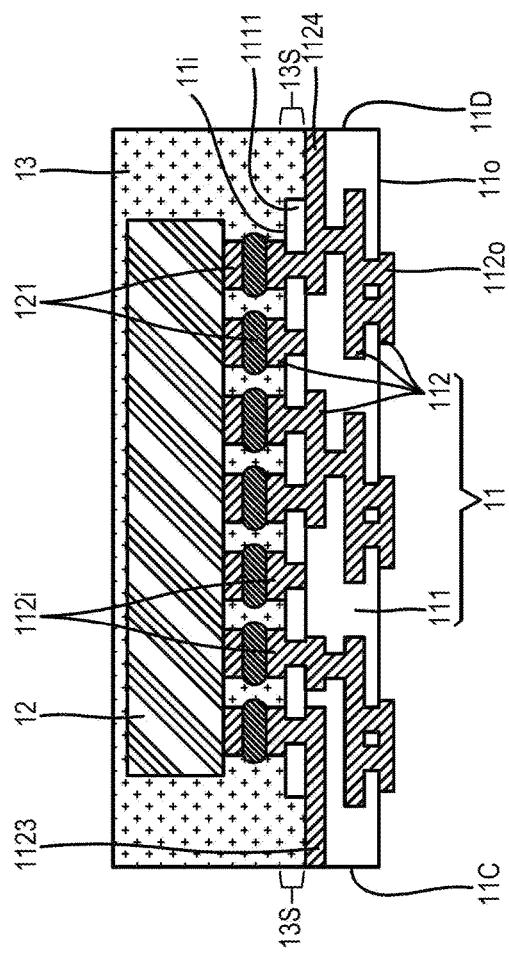

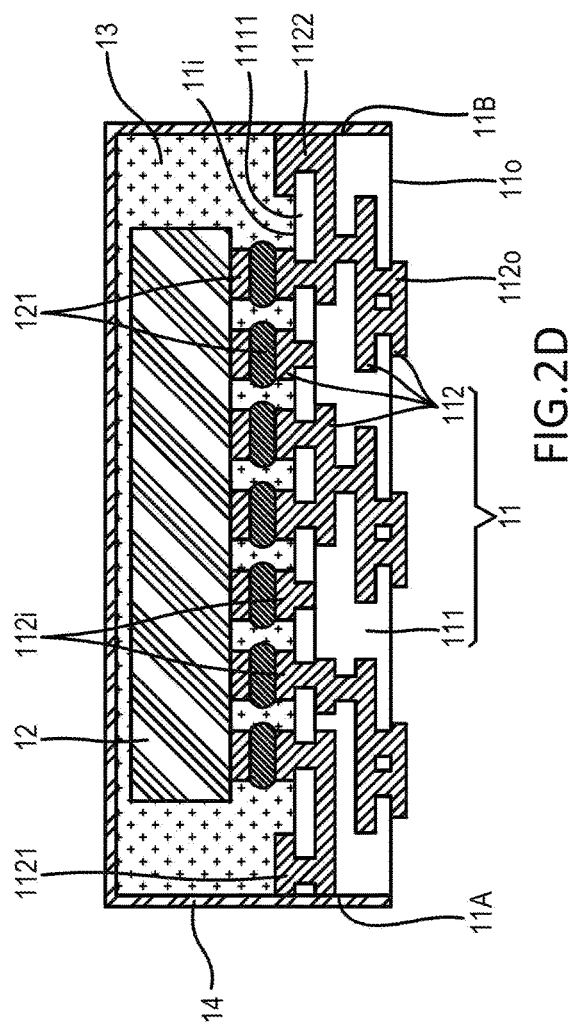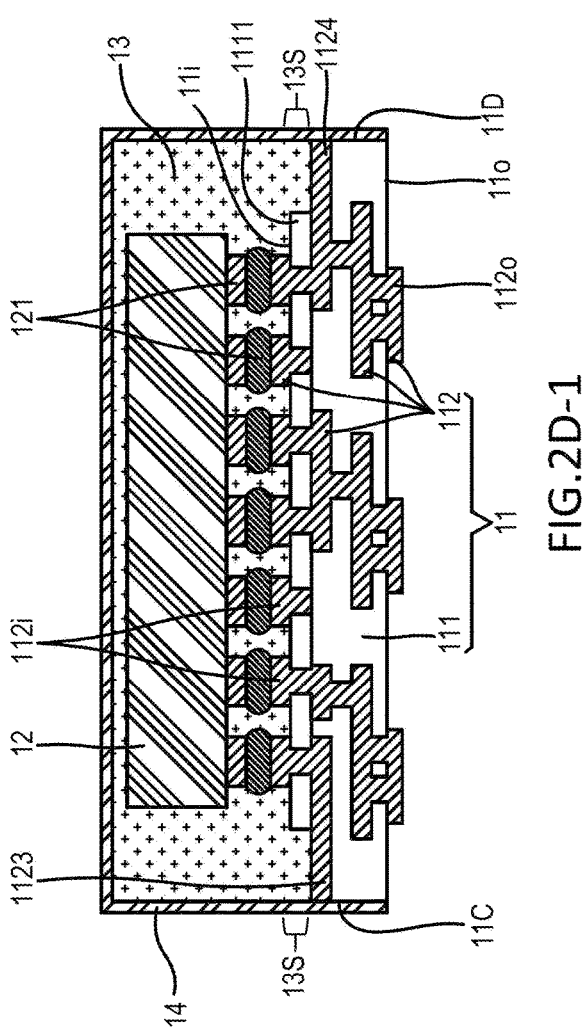
FIG.2D
FIG.2D-1

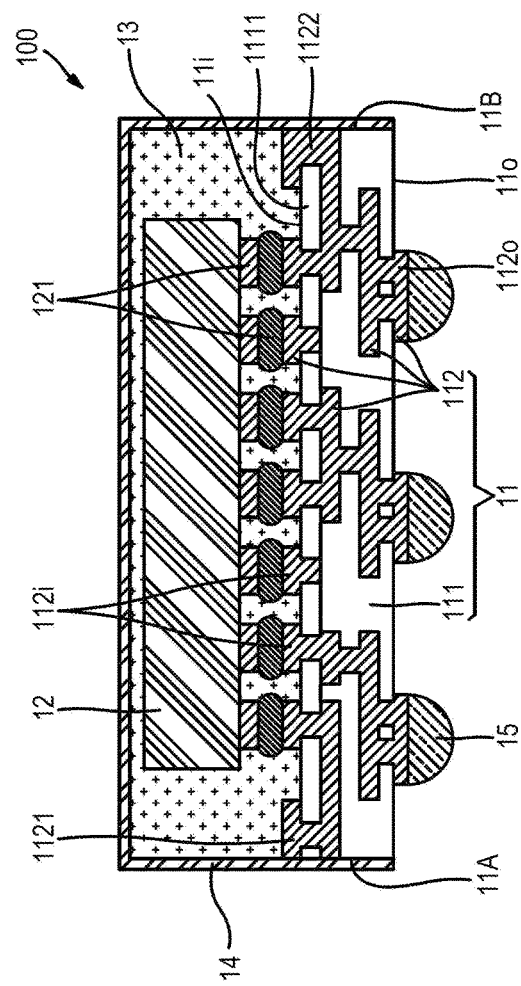
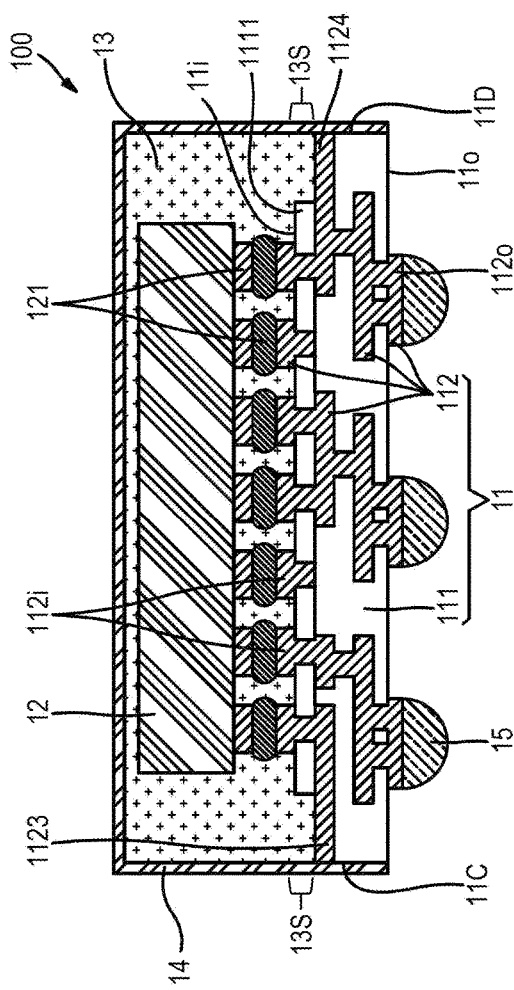
FIG.2E
FIG.2E-1

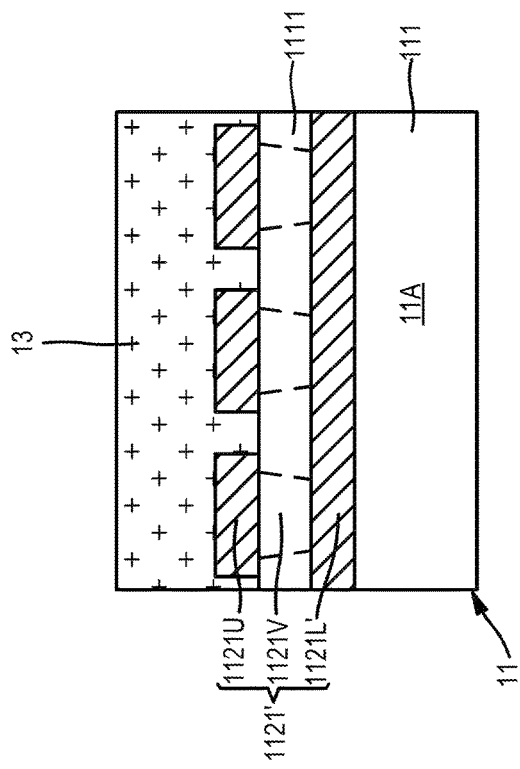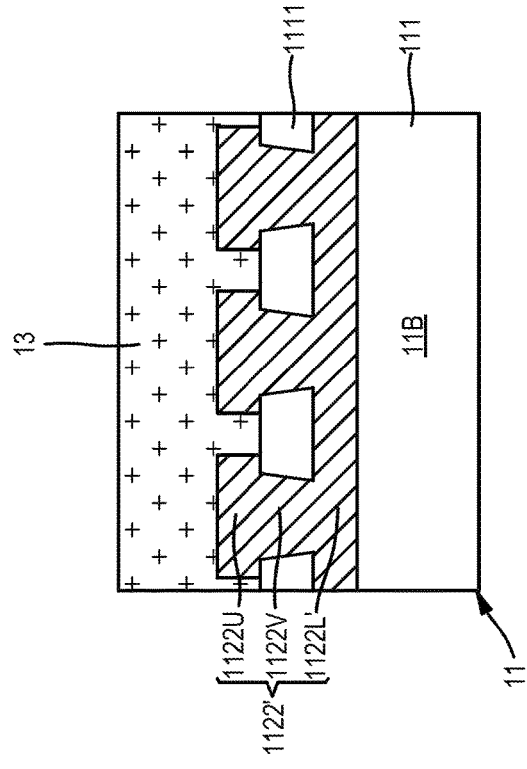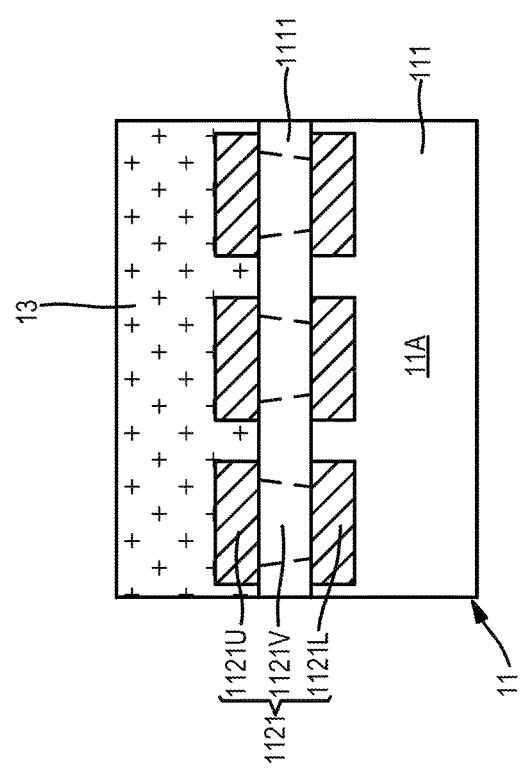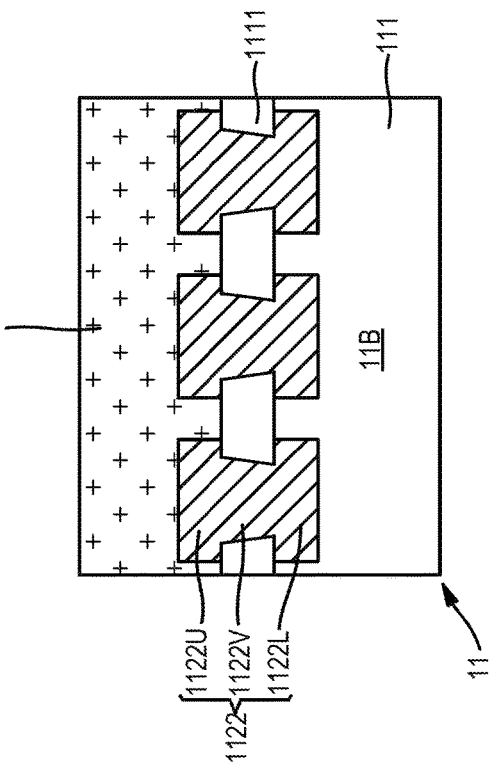
FIG.4A-1  FIG.4B-1  FIG.4A  FIG.4B

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, and 2E show cross-sectional views, taken along the line A-A' in FIG. 1C, of an example method for manufacturing an example electronic device.

FIGS. 2A-1, 2B-1, 2C-1, 2D-1, and 2E-1 show cross-sectional views, taken along the line B-B' in FIG. 1C, of an example method for manufacturing an example electronic device.

FIGS. 3A and 3A-1 show a left-side view of the exemplary electronic device shown in FIG. 2A.

FIGS. 3B and 3B-1 show a right-side view of the exemplary electronic device shown in FIG. 2A.

FIGS. 4A and 4A-1 show a left-side view of the exemplary electronic device shown in FIG. 2C.

FIGS. 4B and 4B-1 show a right-side view of the exemplary electronic device shown in FIG. 2C.

Figure 1A:
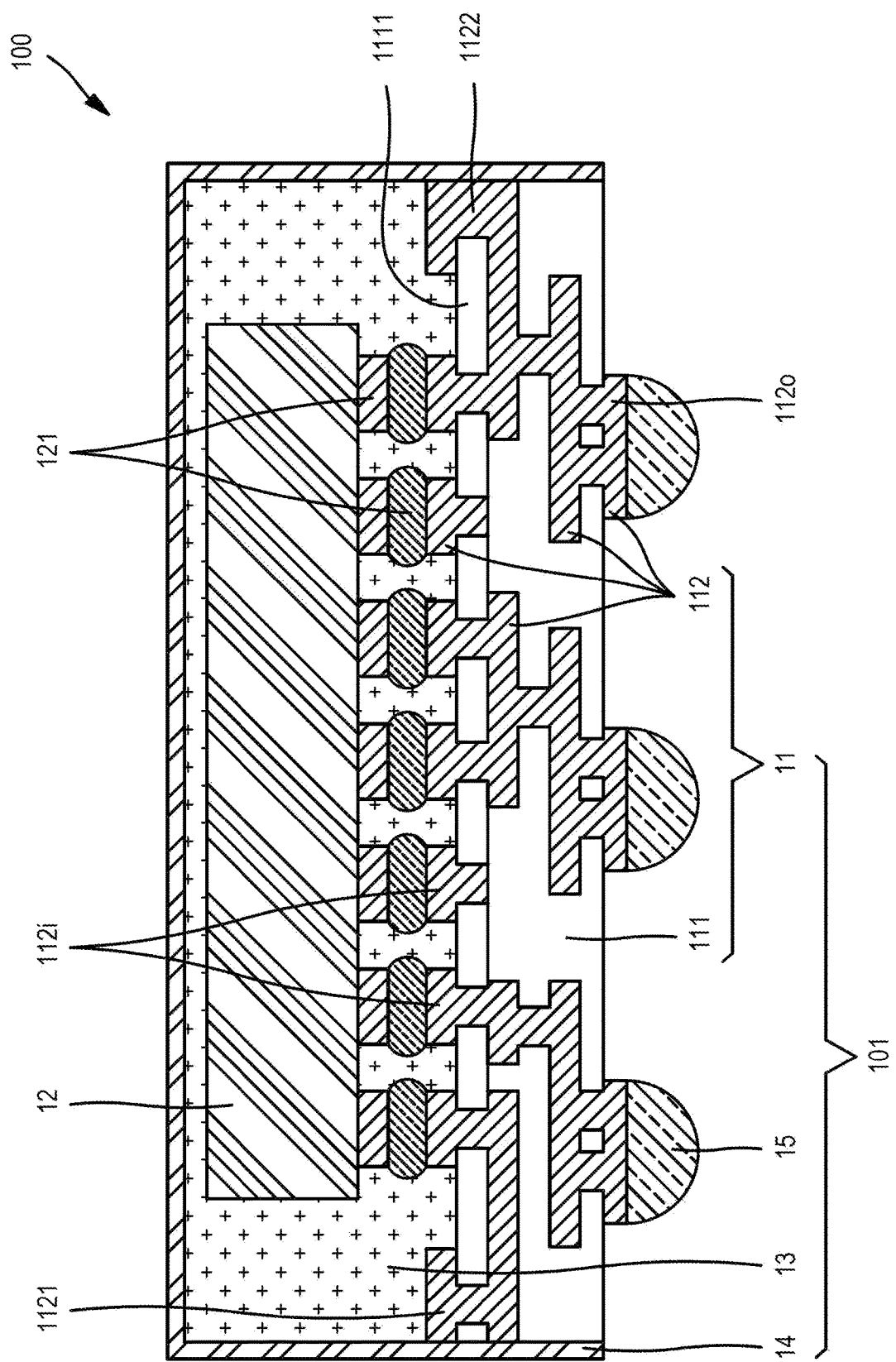
FIGS. 1A and 1B show cross-sectional views of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g.," are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or." As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including" are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or to describe two elements indirectly coupled by one or more other elements. For example, if element A is coupled to element B, then element A can be directly contacting element B or indirectly coupled to element B by an intervening element C. As used herein, the term coupled can refer to an electrical coupling or a mechanical coupling. Similarly, the terms "over" or "on" may be used to describe two elements directly contacting each other or describe two elements indirectly coupled by one or more other elements.

DESCRIPTION

In one example, an electronic device comprises a substrate comprising a conductive structure and a dielectric structure, the dielectric structure comprising an upper dielectric layer, an electronic component over a top side of the substrate and coupled with the conductive structure, an encapsulant over the top side of the substrate and adjacent a lateral side of the electronic component, and a shield over the top side of the electronic component and contacting a lateral side of the encapsulant and a first lateral side of the substrate. The conductive structure comprises a first tab structure at the first lateral side of the substrate, and wherein the first tab structure contacts the shield and extends above the upper dielectric layer.

In another example, an electronic device comprises a substrate comprising a conductive structure and a dielectric structure, the dielectric structure comprising an upper dielectric layer, an electronic component over a top side of the substrate and coupled with the conductive structure, an encapsulant over the top side of the substrate and adjacent a lateral side of the electronic component, and a shield over the top side of the electronic component and contacting a lateral side of the encapsulant and a first lateral side of the substrate. The conductive structure comprises a first tab structure at the first lateral side of the substrate, wherein the first tab structure contacts the shield and is below the upper dielectric layer.

In a further example, a method to manufacture an electronic device comprises providing a substrate comprising a conductive structure and a dielectric structure, the dielectric structure comprising an upper dielectric layer, providing an electronic component over a top side of the substrate and coupled with the conductive structure, providing an encapsulant over the top side of the substrate and adjacent a lateral side of the electronic component, and providing a shield over the top side of the electronic component and contacting a lateral side of the encapsulant and a first lateral side of the substrate. The conductive structure comprises a first tab structure at the first lateral side of the substrate, and wherein the first tab structure contacts the shield and extends above the upper dielectric layer.

Other examples are included in the present disclosure. Such examples may be found in the figures, in the claims, or in the description of the present disclosure.

Figure 1B:
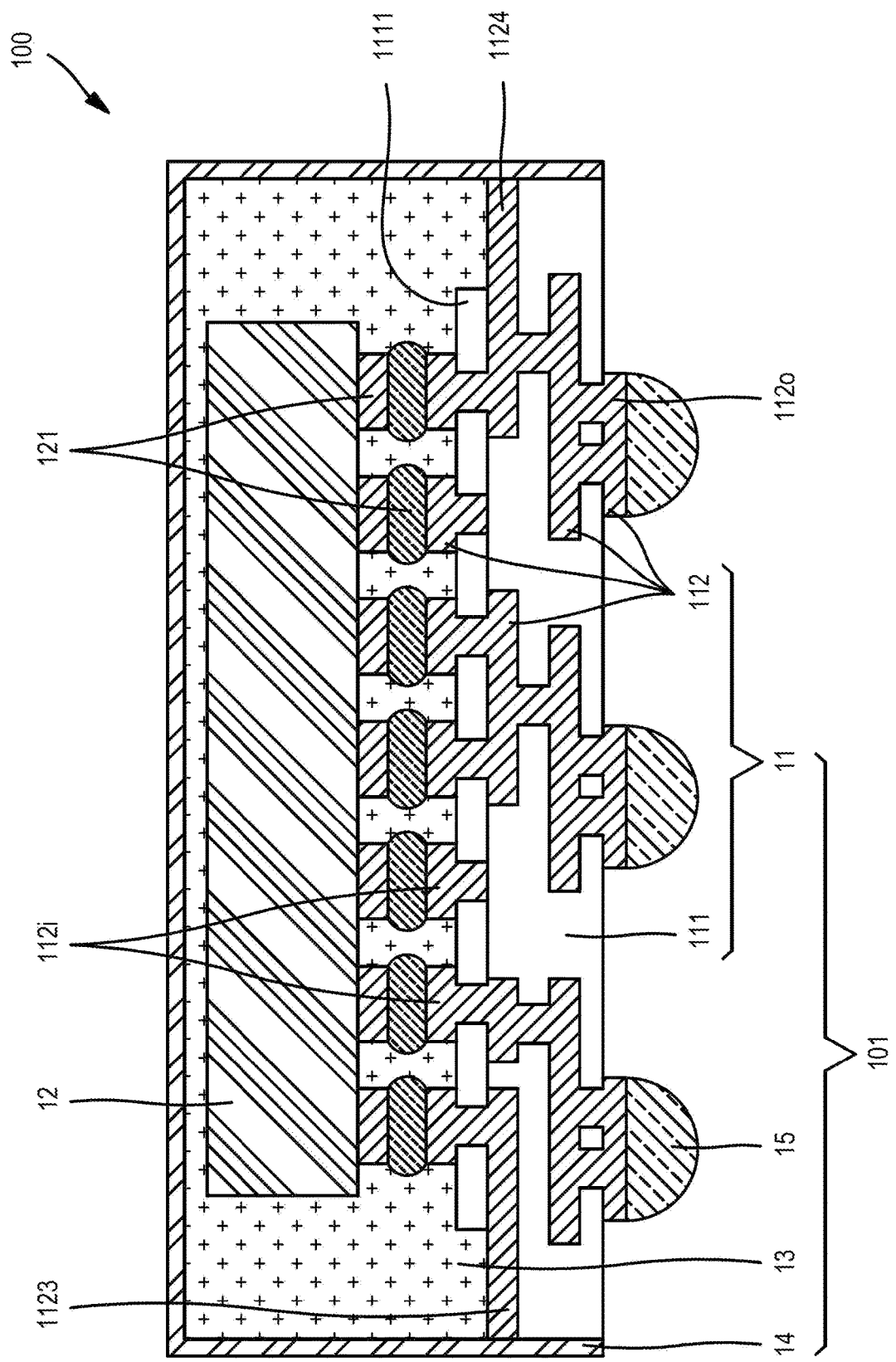
Figure 1C:
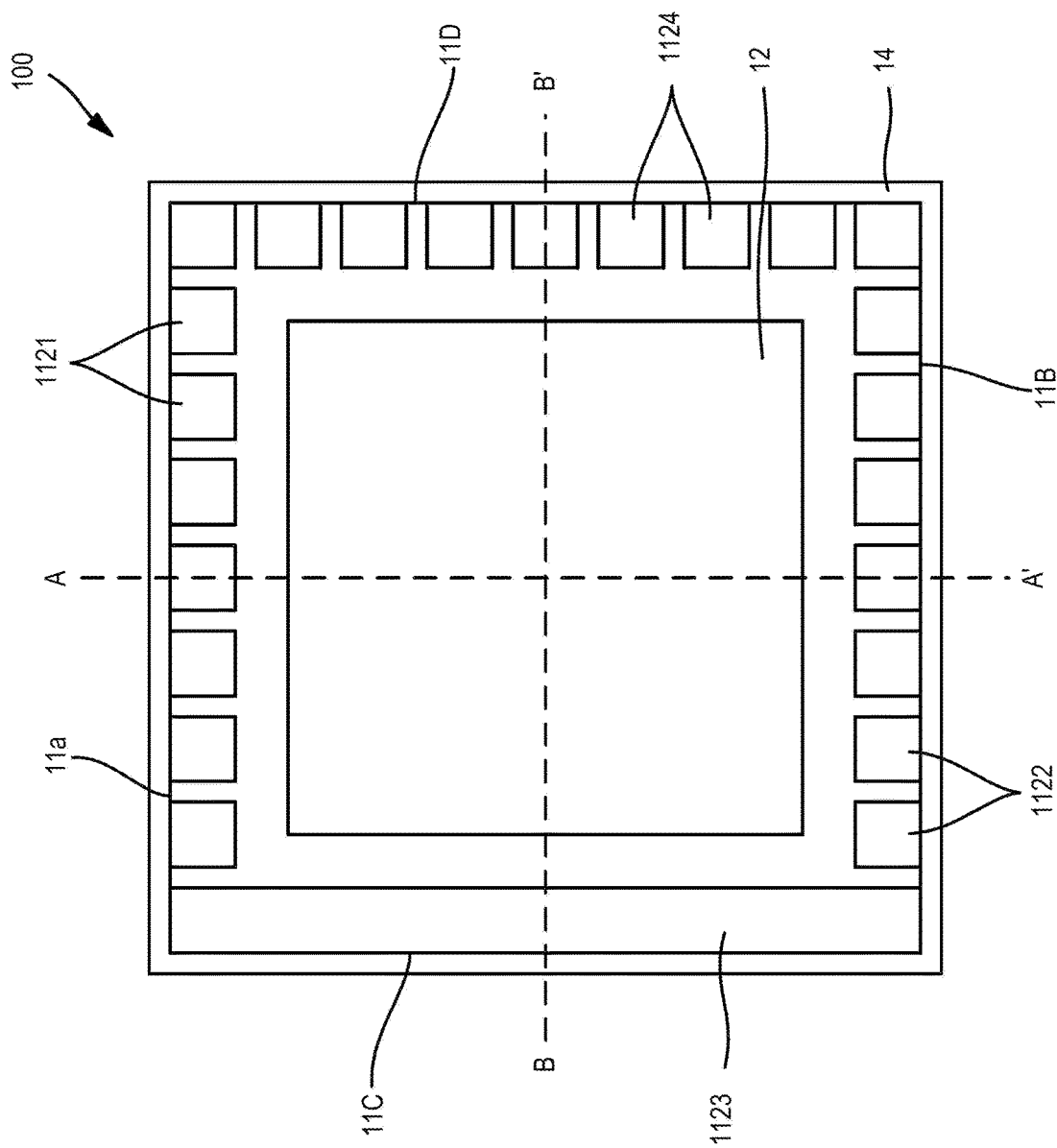
FIG. 1C shows a plan view an example electronic device.

FIGS. 1A and 1B show cross-sectional views and FIG. 1C shows a top view illustrating an exemplary electronic device 100. FIG. 1A is a cross-sectional view taken along line A-A' in FIG. 1C, and FIG. 1B is a cross-sectional view taken along line B-B' in FIG. 1C. FIG. 1C is a top plan view of electronic device 100 shown through an encapsulant 13 and a shield 14 of electronic device 100.

In the example shown in FIGS. 1A, 1B and 1C, electronic device 100 can comprise substrate 11, electronic component 12, encapsulant 13, shield 14, and external interconnects 15. Substrate 11 can comprise dielectric structure 111 and conductive structure 112. Dielectric structure 111 can comprise one or more dielectric layers, including an upper dielectric layer 1111. Conductive structure 112 can comprise tab structures 1121, 1122, 1123, or 1124 at the lateral sides of substrate 11. Conductive structure 112 can also comprise inward terminals 112i and outward terminals 112o. Electronic component 12 can comprise component interconnects 121. Electronic component 12 can be over the top side of substrate 11 and can be coupled with conductive structure 111. Encapsulant 13 can be over the top side of substrate 11 and adjacent to a lateral side of electronic component 12. Shield 14 can be over the top side of electronic component 12 and can contact a lateral side of encapsulant 13 and a lateral side of substrate 11. In some examples, tab structures 1121, 1122, 1123, or 1124 can contact shield 14 and can extend above upper dielectric layer 1111. In some examples, tab structures 1121 or 1122 can extend above upper dielectric layer 1111 and can contact shield 14, and tab structures 1123 or 1124 can be below upper dielectric layer 1111 and can contact shield 14. In some examples, a portion of upper side of tab structure 1123 or 1124 can be exposed from upper dielectric layer 1111, and upper dielectric layer 1111 can be over another portion tab structure 1123 or 1124.

Substrate 11, encapsulant 13, shield 14, and external interconnects 15 can comprise or be referred to as electronic package 101 or package 101. Electronic package 101 can protect electronic component 12 from exposure to external elements or environments. Electronic package 101 can also provide coupling between electronic component 12 and one or more external components or other electronic packages.

FIGS. 2A to 2E and 2A-1 to 2E-1 show cross-sectional views of an example method for manufacturing electronic device 100. FIGS. 2A, 2B, 2C, 2D, and 2E show cross-sectional views taken along line A-A' in FIG. 1C. FIGS. 2A-1, 2B-1, 2C-1, 2D-1, and 2E-1 show cross-sectional views taken along line B-B' in FIG. 1C.

Figure 2B:
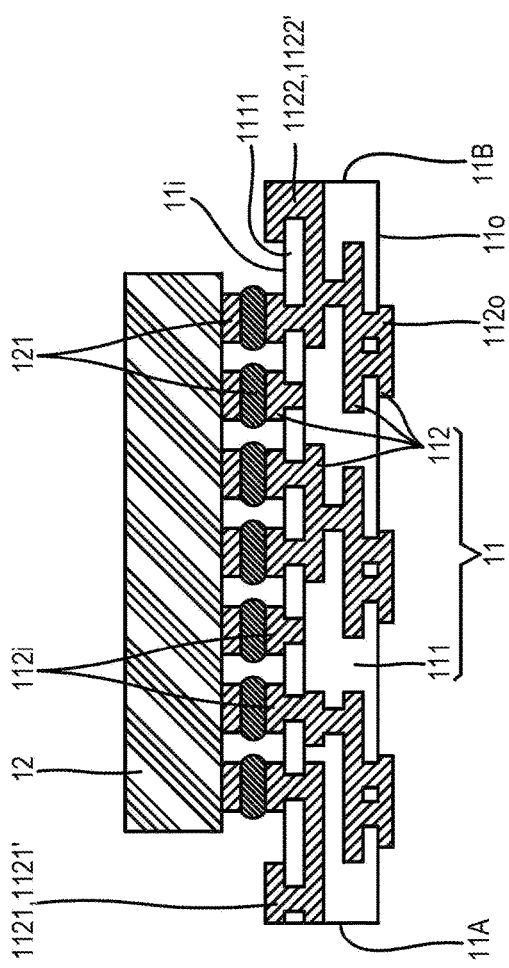
Figures 1, 2B:
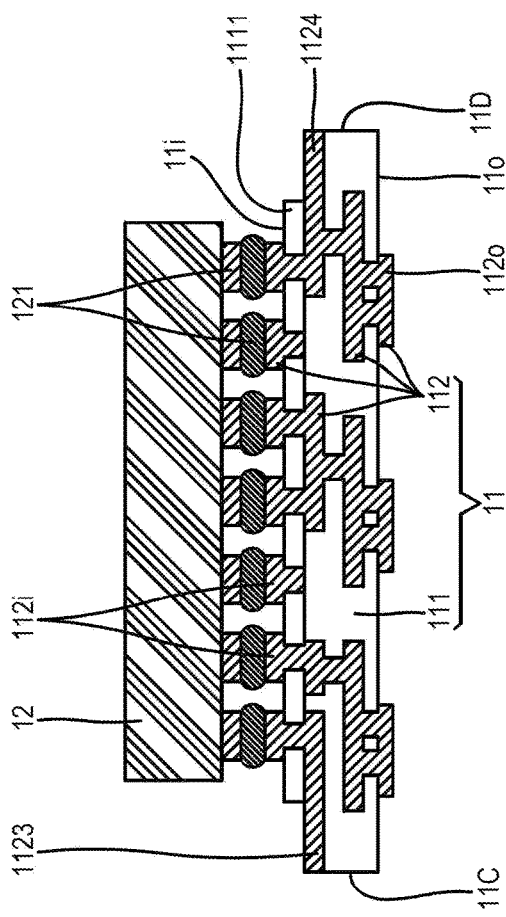

FIGS. 2A and 2A-1 are cross-sectional views of electronic device 100 at an early stage of manufacture. In accordance with various examples, substrate 110 can comprise dielectric structure 111 and conductive structure 112.

In some examples, dielectric structure 111 can comprise or be referred to as one or more stacked dielectric layers. For instance, the one or more dielectric layers can comprise, one or more core layers, polymer layers, pre-preg layers, or solder mask layers stacked on each other. One or more layers or elements of conductive structure 112 can be interleaved with the dielectric layers. The upper and lower sides of dielectric structure 111 can be part of substrate inner side 11i and substrate outer side 110 of substrate 11, respectively. Substrate outer side 110 is opposite to substrate inner side 11i. Substrate 11 can have substrate lateral sides, such as first lateral side 11A, second lateral side 11B, third lateral side 11C, and fourth lateral side 11D, connecting substrate inner side 11i and substrate outer side 110. In some examples, dielectric structure 111 can comprise an epoxy resin, a phenolic resin, a glass epoxy, a polyimide, a polyester, an epoxy molding compound, or a ceramic.

Dielectric structure 111 comprises upper dielectric layer 1111 located at inner side 11i of substrate 11 (e.g., upper dielectric layer 1111 can form, at least, a portion of inner side 11i of substrate 11). In some examples, upper dielectric layer 1111 can comprise or be referred to as a passivation layer, a solder mask, or a solder resist. For example, upper dielectric layer 1111 can comprise an epoxy resin or a phenolic resin. In some examples, the thickness of dielectric structure 111, as measured between inner side 11i and outer side 110 of substrate 11, can range from approximately 10 micrometers (μm) to 500 μm.

Conductive structure 112 can comprise one or more conductive layers. Conductive structure 112 can comprise one or more traces, pads, vias, or wiring patterns. Conductive structure 112 can comprise inward terminals 112i provided on substrate-inner side 11i and outward terminals 112o provided on substrate-outer side 11o. Inward terminals 112i and outward terminals 112o can be spaced apart from each other in a rows or columns along substrate-inner side 11i and substrate-outer side 11o, respectively. In some examples, inward terminal 112i and/or outward terminal 112o can comprise or be referred to as a conductor, a substrate land, a conductive land, a substrate pad, a wiring pad, a connection pad, a micro pad, or under-bump-metallurgy (UBM). In some examples, conductive structure 112 can comprise one or more layers of copper, iron, nickel, gold, silver, palladium, or tin. In some examples, the thicknesses of each of inward terminals 112i and outward terminals 112o can range from approximately 10 μm to 100 μm.

Figure 3A:
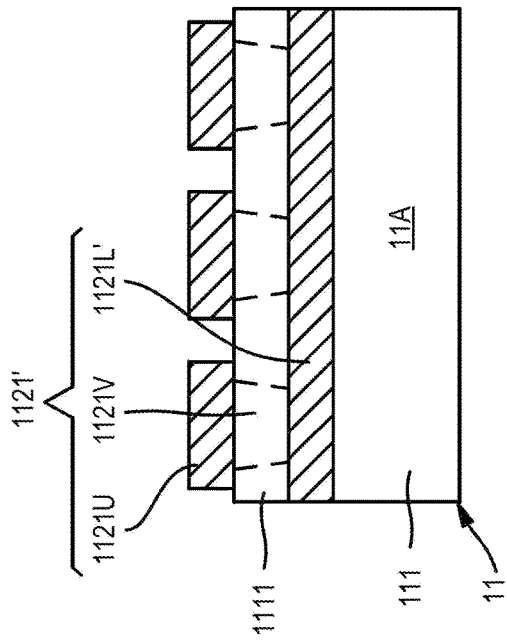
Figures 1, 3A:
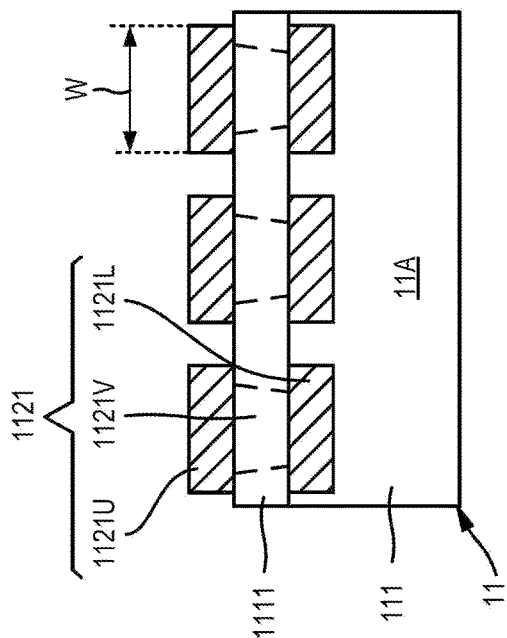
Figure 3B:
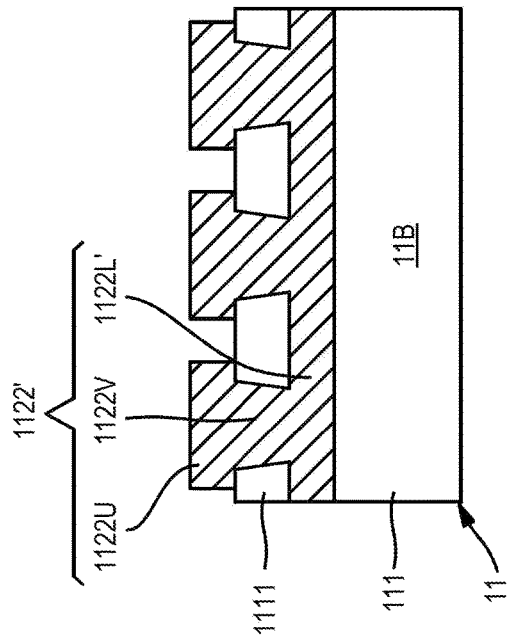
Figures 1, 3B:
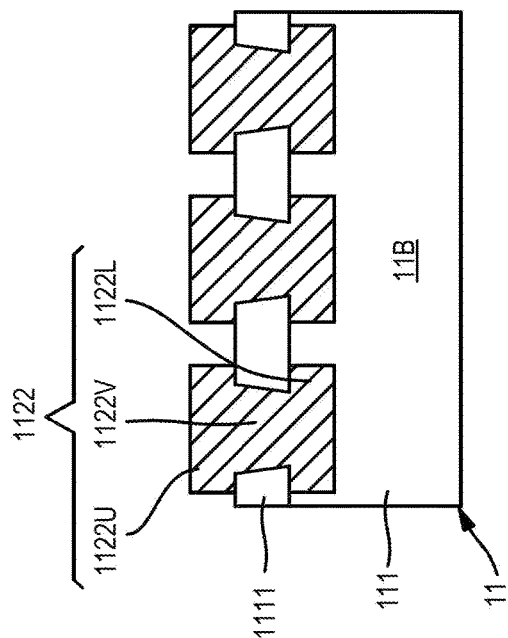
Figure 3D:
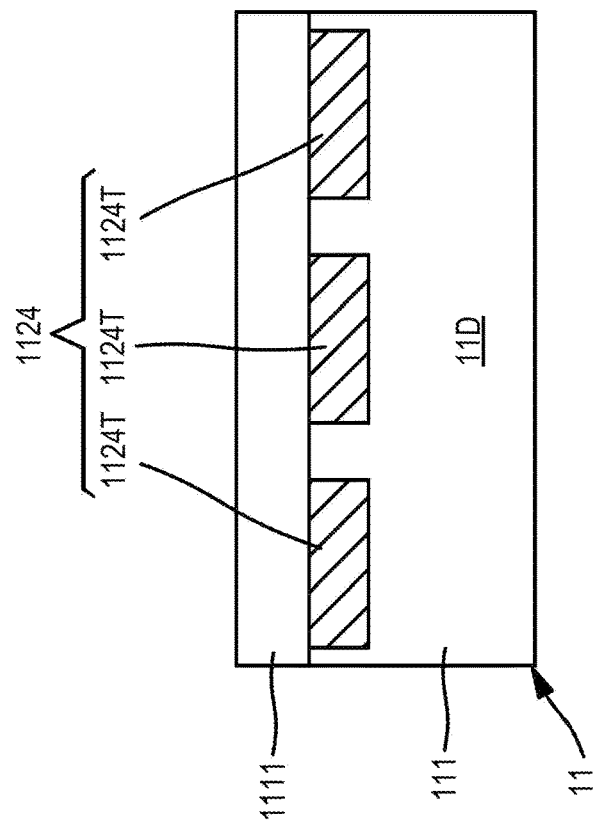
FIGS. 3C and 3D show a left-side view and a right-side view, respectively of the exemplary electronic device shown in FIG. 2A-1.
Figure 3C:
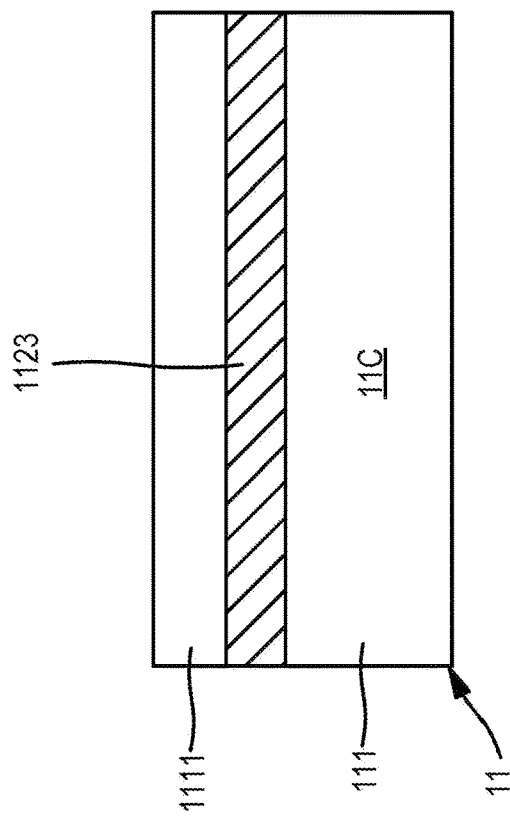

FIGS. 3A and 3A-1 show first lateral side 11A of substrate 11 in FIG. 2A. FIGS. 3B and 3B-1 show second lateral side 11B of substrate 11 in FIG. 2A-1. FIG. 3C shows third lateral side 11C of substrate 11 in FIG. 2A-1. FIG. 3D shows fourth lateral side 11D of substrate 11 in FIG. 2A-1. In the example shown in FIGS. 2A, 2A-1 and FIGS. 3A to 3D, conductive structure 112 can comprise tab structures 1121, tab structures 1121', tab structures 1122, tab structures 1122', tab structures 1123, or tab structures 1124. Tab structures 1121, 1121', 1122, 1122', 1123, and 1124 are each exposed from substrate-inner side 11i. Tab structures 1121 and 1121' are also exposed from first lateral side 11A of substrate 11. Tab structures 1122 and 1122' are also exposed from second lateral side 11B of substrate 11. Tab structures 1123 are also exposed from third lateral side 11C of substrate 11. Tab structures 1124 are also exposed from fourth lateral side 11D of substrate 11. In some examples, inward terminals 112i can be positioned in a central region 111c of substrate-inner side 11i, and tab structures 1121, 1121', 1122, 1122', 1123, and 1124 can be positioned in a perimeter region 11p of substrate-inner side 11i. Perimeter region 111p can surround central region 111c. Tab structure 1123 can extend continuously across the lateral side of substrate 11.

With reference to FIG. 3A, in accordance with various examples, tab structure 1121 can comprise upper tab 1121U located over upper dielectric layer 1111, lower tab 1121L located under upper dielectric layer 1111, and tab via 1121V located or extending through upper dielectric layer 1111 and coupled between upper tab 1121U and lower tab 1121L. Stated differently, upper dielectric layer 1111 may be sandwiched between upper tab 1121U and lower tab 1121L.

Upper tab 1121U and lower tab 1121L can be exposed from first lateral side 11A of substrate 11 (e.g., upper tab 1121U and lower tab 1121L can be exposed from dielectric structure 111 at first lateral side 11A). Upper dielectric layer 1111 can be located between tab via 1121V and first lateral side 11A (e.g., tab via 1121V is covered/not exposed). In some examples, as shown for example in FIG. 2E, upper tab 1121U and lower tab 1121L can contact shield 14, and upper dielectric layer 1111 can be between tab via 1121V and shield 14.

Upper tabs 1121U can be located on inner side 11$i$ of substrate 11. Upper tabs 1121U can be spaced apart from each other along inner side 11$i$ and along first lateral side 11A of substrate 11. In some examples, upper tabs 1121U can comprise or be referred to as exposed traces, paths, or portions of conductive structure 112.

Lower tabs 1121L can be spaced apart from each other along first lateral side 11A of substrate 11 and can be exposed from first lateral side 11A. Lower tabs 1121L can be located under upper tabs 1121U (e.g., lower tabs 1121L can be vertically aligned with upper tabs 1121U). In some examples, a width W of upper tabs 1121U, as measured in a direction parallel to first lateral side 11A, can be equal, or approximately equal, to a width of lower tabs 1121L. In some examples, a length L, with momentary reference to FIG. 2A, of upper tabs 1121U, as measured in a direction perpendicular to first lateral side 11A, can be less than the length of lower tabs 1121L. Lower tabs 1121L can be connected upper tabs 1121U through covered tab vias 1121V. In some examples, lower tabs 1121L can also be connected to inward terminals 112$i$ through one or more components of conductive structure 112 (e.g., through conductive vias and/or traces). For example, inward terminals 112$i$ that are coupled to lower tabs 1121L can comprise or be referred to as ground terminals. At least a portion of lower tabs 1121L can be covered by upper dielectric layer 1111. In some examples, lower tabs 1121L can comprise or be referred to as exposed segmented traces, paths, or portions.

Tab vias 1121V penetrate the upper and lower sides of upper dielectric layer 1111 layer (e.g., tab vias 1121V extend completely through upper dielectric layer 1111). Tab vias 1121A can couple upper tabs 1121U to lower tabs 1121L. The lateral sides of covered tab vias 1121V can be covered by upper dielectric layer 1111 (e.g., tab vias 1121V are not exposed). Tab vias 1121V can be located inside upper dielectric layer 1111. In some example, one (ora single) upper tab 1121U can be coupled to one (ora single) lower tab 1121L through one (or a single) tab via 1121V.

Tab via 1121V coupled to upper tab 1121U and lower tab 1121L tends to reduce or prevent delamination between tab structure 1121 and dielectric structure 111. Further, should delamination begin to occur, propagation of delamination is reduced or prevented by tab via 1121V. Lower tab 1121L having multiple portions exposed from first lateral side 11A also tends to reduce or prevent propagation of delamination. In some examples, the thicknesses of upper tab 1121U and lower tab 1121L can each range from approximately 10 μm to approximately 100 μm. The thickness of tab via 1121V can range from approximately 10 μm to approximately 100 μm.

With reference to FIG. 3A-1, tab structure 1121' can comprise upper tabs 1121U, lower tab 1121L', and tab vias 1121V. In some examples, upper tabs 1121U and tab vias 1121V of tab structure 1121' are similar, respectively, to upper tabs 1121U and covered tab vias 1121V of tab structure 1121, as previously described. In accordance with various examples, lower tab 1121L' can extends continuously for, at least, the total width of upper tabs 1121U. Stated differently, multiple upper tabs 1121U and tab vias 1121V may be coupled to a single lower tab 1121L'. In some examples, lower tab 1121L' can be exposed from first lateral side 11A and can extend from third lateral side 11C to fourth lateral side 11D, with momentary reference to FIG. 1C. In some examples, lower tab 1121L' can comprise or be referred to as an exposed continuous trace, path, or portion. Upper tabs 1121U can be coupled to one lower tab 1121L through tab vias 1121V.

With reference to FIG. 3B, tab structure 1122 can comprise upper tabs 1122U, lower tabs 1122L, and tab vias 1122V. In some examples, upper tabs 1122U and lower tabs 1122L of tab structure 1122 can be similar to upper tabs 1121U and lower tabs 1121L, respectively, of tab structure 1121, as previously described. In accordance with various examples, tab vias 1122V can be exposed from second lateral side 11B of substrate 11. In this regard, tab vias 1122V can be exposed from dielectric structure 111. Tab vias 1122V can penetrate dielectric layer 1111 and couple upper tabs 1122U to lower tabs 1122L. In some examples, one upper tab 1122U can be coupled to one lower tab 1122L through one tab via 1122V. In some examples, upper tab 1122U, lower tab 1122L, and tab via 1122V can contact shield 14 at a lateral side of substrate 11.

With reference to FIG. 3B-1, tab structure 1122' can comprise upper tabs 1122U, lower tab 1122L', and tab vias 1122V. In some examples, upper tabs 1122U and tab vias 1122V may be similar to upper tabs 1122U and tab vias 1122V, respectively, of tab structures 1122, as previously described. In some examples, lower tab 1122' of tab structure 1122' may be similar to lower tab 1121L' of tab structure 1121', as previously described.

With reference to FIG. 3C, tab structure 1123 can extend continuously across third lateral side 11C. For example, tab structure 1123 can extend from first lateral side 11A to second lateral side 11B, with momentary reference to FIG. 1C. In accordance with various examples, tab structure 1123 can be similar to the lower tab 1121L' of tab structure 1121. With combined reference to FIG. 2A-1 and FIG. 3C, at least, a first portion of the upper side of tab structure 1123 is exposed from upper dielectric layer 1111. In some examples, upper dielectric layer 1111 may be located over a second portion of tab structure 1123. In some examples, upper dielectric layer 1111 can be partially removed by a laser or by etching to expose tab structure 1123. Upper dielectric layer 1111 can have a lateral side located on tab structure 1123. Exposing tab structure 1123 from upper dielectric layer 1111 tends to reduce or prevent delamination of upper dielectric layer 1111 at third lateral 11C (e.g., recessing upper dielectric layer 1111 relative to third lateral side 11C eliminates delamination at third lateral side 11C). Tab structure 1123 can be exposed from inner side 11$i$ of substrate 11 and from third lateral side 11C of substrate 11. In some examples, tab structure 1123 can comprise or be referred to as exposed continuous trace, path, or portion provided along a majority or a full span of second lateral side 11B of substrate 11.

With reference to FIG. 3D, tab structure 1124 can include a plurality of tabs 1124T spaced apart from one another along fourth lateral side 11D. In accordance with various examples, tabs 1124T can be similar to the lower tabs 1121L of tab structure 1121, as previously described. With combined reference to FIG. 2A-1 and FIG. 3D, at least, a first portion of the upper side of tabs 1124T is exposed from upper dielectric layer 1111. In some examples, upper dielectric layer 1111 may be located over a second portion of tabs 1124T. In some examples, upper dielectric layer 1111 can be partially removed by a laser or by etching to expose tabs 1124T. Upper dielectric layer 1111 can have a lateral side located on tabs 1124T. Exposing tabs 1124T from upper dielectric layer 1111 tends to reduce or prevent delamination of upper dielectric layer 1111 at fourth lateral 11D (e.g., recessing upper dielectric layer 1111 relative to fourth lateral side 11D eliminates delamination at fourth lateral side 11D). Tabs 1124T can be exposed from inner side 11*i* and fourth lateral side 11D of substrate 11. In some examples, tabs 1124T can comprise or be referred to as exposed segmented traces, paths, or portions. Tab structure 1124 include multiple tabs 1124T exposed at fourth lateral side 11D tends to reduce of prevent propagation of delamination should it occur. Tab structure 1124 can comprise spaced apart tabs 1124T across a lateral side of substrate 111, and dielectric structure 111 can be between the spaced apart tabs 1124T.

Returning to FIGS. 2A and 2A-1, in some examples, substrate 11 can comprise or be referred to as a laminate substrate, a ceramic substrate, a rigid substrate, a glass substrate, a silicon substrate, a printed circuit board, a multilayer substrate, or a molded lead frame. In some examples, substrate 11 can comprise or be referred to as a redistribution layer ("RDL") substrate, a buildup substrate, or a coreless substrate. An area (or "footprint") of substrate 11 can be selecting according to the area or number of electronic components 12 coupled to substrate 11. In some examples, substrate 11 can have an area of about 8 millimeters (mm) by 8 mm to about 150 mm by 150 mm. In some examples, substrate 11 can have a thickness of about 0.2 mm to about 4 mm.

In some examples, substrate 11 can be a RDL substrate. RDL substrates can comprise one or more conductive redistribution layers and one or more dielectric layers and (a) can be formed layer by layer over an electronic device to which the RDL substrate is to be coupled, or (b) can be formed layer by layer over a carrier and then entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of one or more inorganic dielectric layers can comprise silicon nitride (Si3N4), silicon oxide (SiO2), or silicon oxynitride (SiON). The one or more inorganic dielectric layers can be formed by growing the inorganic dielectric layers using an oxidation or nitridization process rather than using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate.

In some examples, substrate 11 can be a pre-formed substrate. Pre-formed substrate can be manufactured prior to attachment to an electronic device and can comprise dielectric layers between respective conductive layers. The conductive layers can comprise, for example, copper and can be formed using an electroplating process. The dielectric layers can be non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrates can be formed through a semi-additive or modified-semi-additive process. Substrates in this disclosure can comprise pre-formed substrates or RDL substrates.

FIGS. 2B and 2B-1 show a cross-sectional view of electronic device 100 at a later stage of manufacture. In the example shown in FIGS. 2B and 2B-1, electronic component 12 can be provided on substrate 11. In some examples, pick-and-place equipment can pick up electronic component 12 and place electronic component 12 on substrate-inner side 11*i* of substrate 11. In some examples, electronic component 12 can be coupled to substrate 11 through mass reflow, thermal compression, or laser assisted bonding. In some examples, electronic component 12 can be coupled to inward terminals 112*i* of substrate 11 through wire bonding. In some examples, electronic component 12 can comprise or be referred to as one or more semiconductor dies, semiconductor chips, or semiconductor packages. In some examples, electronic component 12 can comprise or be referred to as an active element or passive element.

Electronic component 12 can comprise component interconnects 121. Component interconnects 121 can be spaced apart from each other in the row and/or column direction along the inner (or active) surface of electronic component 12. In some examples, component interconnects 121 can comprise or be referred to as pads, bumps, pillars, conductive posts, or solder balls. Component interconnects 121 can comprise a conductive material, such as aluminum, copper, an aluminum alloy, or a copper alloy. Component interconnects 121 can be input/output terminals of electronic component 12 or ground terminals.

In some examples, component interconnects 121 can comprise a low-melting material and can be coupled to inward terminals 112*i* of substrate 11 through the low-melting material. Examples of the low-melting material can comprise one or more of Sn, Ag, Pb, Cu, Sn—Pb, Sn37-Pb, Sn95-Pb, Sn—Pb—Ag, Sn—Cu, Sn—Ag, Sn—Au, Sn—Bi, and Sn—Ag—Cu. The thickness of electronic component 12 can range from approximately 50 μm to approximately 800 μm, and the area can range from approximately 0.5 mm by 0.5 mm to approximately 70 mm by 70 mm.

Although electronic component 12 is shown coupled to inward terminal 112*i* face-down or in a flip-chip configuration, it is contemplated and understood that in various examples, electronic component 12 can be coupled to inward terminal 112*i* face-up or in a wire-bond configuration.

Figure 4D:
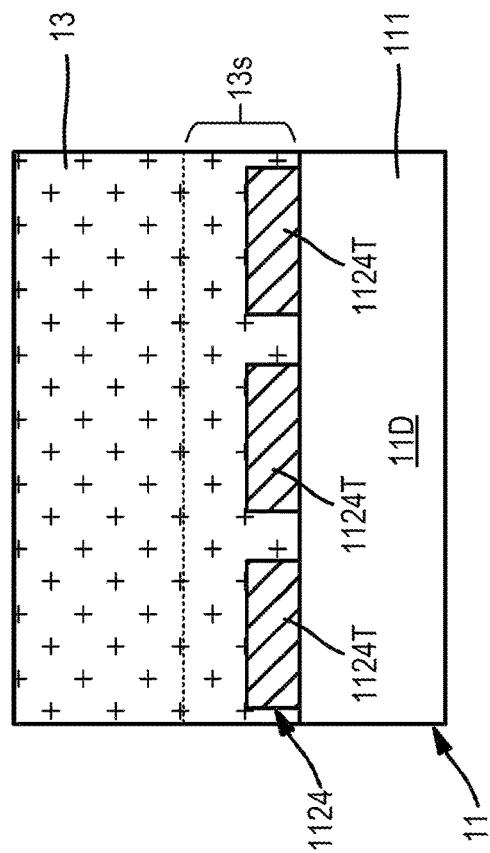
FIGS. 4C and 4D show a left-side view and a right-side view, respectively, of the exemplary electronic device shown in FIG. 2C-1.
Figure 4C:
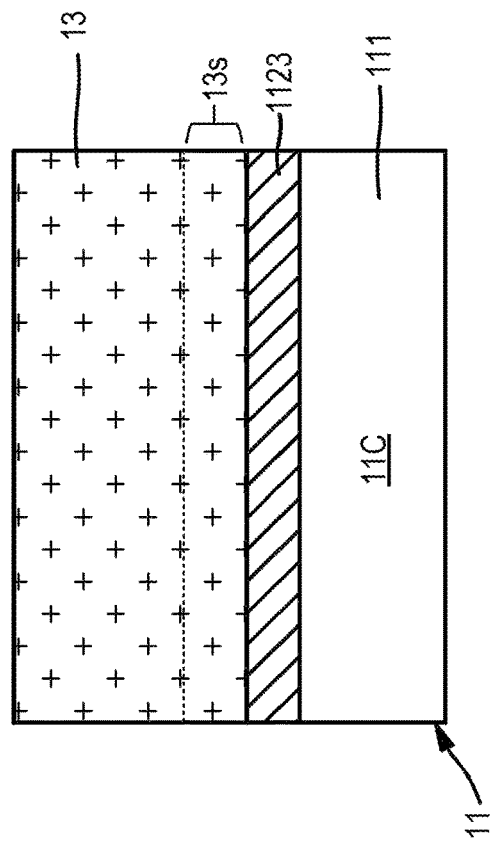

FIGS. 2C and 2C-1 show electronic device 10 at a later stage of manufacture. FIGS. 4A and 4A-1 are left side views of electronic device 10 shown in FIG. 2C. FIGS. 4B and 4B-1 are right side views of electronic device 10 shown in FIG. 2C. FIGS. 4C and 4D are a left-side view and a right-side view, respectively, of electronic device 10 shown in FIG. 2C-1.

In accordance with various examples, encapsulant 13 can be provided to cover substrate 11 and electronic component 12. In some examples, encapsulant 13 can provided over and can contact inner side 11*i* of substrate 11. Encapsulant 13 can also be provided over and can contact the top and lateral sides of electronic component 12. Encapsulant 13 can have lateral sides coplanar with lateral sides 11A, 11B, 11C, 11D of substrate 11. Encapsulant 13 can cover, contact, and extend between upper portions of tab structures 1121, 1121', 1122, 1122', 1123, and 1124.

In some examples, encapsulant 13 can comprise or be referred to as a body or a molding. For example, encapsulant 13 can comprise an epoxy mold compound, a resin, an organic polymer with an inorganic filler, a curing agent, a catalyst, a coupling agent, a colorant, or a flame retardant, and can be formed by compression molding, transfer molding, liquid body molding, vacuum lamination, paste printing, or film assist molding. In some examples, the top side of electronic component 12 can be exposed from the upper portion of encapsulant 13 (e.g., encapsulant 13 can be coplanar with the top side of electronic component 12). Encapsulant 13 can protect electronic component 12, tab structures 1121, 1121', 1122, 1122', 1123, and 1124, and inner side 11*i* of substrate 11 from external elements. In some examples, the thickness of encapsulant 13 can range from approximately 100 μm to approximately 1000 μm.

Referring now to FIG. 2C-1 and FIGS. 4C and 4D, in some examples, encapsulant 13 can comprise skirt portion 13S. Skirt portion 13S of encapsulant 13 is located on tab structures 1123 and 1124 and between the lateral sides of upper dielectric layer 1111 and the third and fourth lateral sides 11C, 11D of substrate 11. For example, skirt portion 13S can contact the top sides of tab structures 1123 or 1124 and the lateral sides of upper dielectric layer 1111. Skirt portion 13S of encapsulant 13 can be over a top side of tab structures 1123 or 1124 and can contact upper dielectric layer 1111, including for example a lateral side of upper dielectric layer 1111 as shown in FIG. 2E-1. Skirt portion 13S can be over a top side of spaced apart tabs 1124T, and can extend between the spaced apart tabs 1124T.

FIGS. 2D and 2D-1 show a cross-sectional view of electronic device 100 at a later stage of manufacture. In the example shown in FIGS. 2D and 2D-1, shield 14 can be provided over and covering lateral sides 11A, 11B, 11C, 11D of substrate 11 and the top and lateral sides of encapsulant 13. In some examples, shield 14 can comprise one or more metal layers. Shield 14 can contact and be coupled to tab structures 1121, 1121', 1122, 1122', 1123, and 1124 exposed lateral sides 11A, 11B, 11C, 11D. Shield 14 can also be coupled to inward terminals 112*i* through tab structures 1121, 1121', 1122, 1122', 1123, and 1124. Shield 14 can shield electronic component 12 from outside electromagnetic interference.

In some examples, shield 14 can be coupled to and in contact with upper tab 1121U and lower tab 1121L of tab structure 1121. In some examples, shield 14 can be coupled to and in contact with upper tab 1121U and lower tab 1121L' of tab structure 1121'. In some examples, shield 14 can be coupled to and in contact with upper tab 1122U, lower tab 1122L, and tab via 1122V of tab structure 1122. In some examples, shield 14 can be coupled to and in contact with upper tab 1122U, lower tab 1122L', and tab via 1122V of tab structure 1122'. In some examples, shield 14 can be coupled to and in contact with tab structure 1123. In some examples, shield 14 can be coupled to and in contact with tabs 1124T of tab structure 1124.

In some examples, shield 14 can comprise silver (Ag), copper (Cu), aluminum (Al), nickel (Ni), palladium (Pd), or chromium (Cr). In some examples, shield 14 can comprise or be referred to as an electro-magnetic interference (EMI) shied, a lid, or a conformal metallic coating. When shield 14 is a conformal metallic coating, shield can be provided by sputtering, printing, coating, spraying, or plating. In some examples, shield 14 can be a heat-dissipating shield. In some examples, the thickness of shield 14 can range from approximately 0.1 μm to approximately 10 μm.

FIGS. 2E and 2E-1 show a cross-sectional view of electronic device 100 at a later stage of manufacture. In the example shown in FIGS. 2E and 2E-1, external interconnects 15 can be provided over outer side 11O of substrate 11. External interconnects 15 can be coupled to outward terminals 112*o* of conductive structure 112. External interconnects 15 can be coupled to electronic component 12 through conductive structure 112 of substrate 11. In some examples, external interconnects 15 can comprise or be referred to as pillars, solder tips, bumps, or solder balls. In some examples, external interconnects 15 can comprise tin (NS), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 15 can be formed through a reflow process after forming a solder-containing conductive material on the lower sides of outward terminals 112*o* through a ball drop process. In some examples, external interconnects 15 can comprise conductive balls, such as solder balls; conductive pillars, such as copper pillars; or conductive posts with solder caps on copper pillars. External interconnects 15 can have a size of approximately 100 μm to approximately 1200 μm. In some examples, external interconnects 15 can be referred to as external input/output terminals of electronic device 100.

In accordance with various examples, the configuration of tab structures 1121, 1121', 1122, 1122', 1123, and 1124 may prevent or reduce delamination in electronic device 100. It should be noted that electronic device 100 as described herein can include any one or more of the different tab structures discussed herein in various combinations. For example, the lateral sides of substrate 111 all can have tab structures 1124 on all four lateral sides of substrate 111, two of the lateral sides of substrate can have tab structures 1121 on two sides and tab structures 1122 on two other lateral sides, or tab structures 1122' can be on three of the lateral sides of substrate and tab structure 1121 can be on the fourth lateral side of substrate 111, and so on, and the scope of the disclosed subject matter is not limited in this respect.

The present disclosure includes reference to certain examples. It will be understood by those skilled in the art, however, that various changes can be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a substrate comprising a conductive structure and a dielectric structure, the dielectric structure comprising an upper dielectric layer, wherein a topmost side of the upper dielectric layer defines a topmost side of the dielectric structure;
an electronic component over a top side of the substrate and coupled with the conductive structure;
an encapsulant over the top side of the substrate and adjacent a lateral side of the electronic component; and
a shield over the top side of the electronic component and contacting a lateral side of the encapsulant and a first lateral side of the substrate;
wherein the conductive structure comprises a first tab structure at the first lateral side of the substrate, wherein the first tab structure contacts the shield, wherein a topmost side of the first tab structure extends above the topmost side of the upper dielectric layer, and wherein the first tab structure extends to at least a bottommost side of the upper dielectric layer.

2. The electronic device of claim 1, wherein the first tab structure comprises:
a first upper tab over the upper dielectric layer;
a first lower tab under the upper dielectric layer; and
a first tab via coupled with the first upper tab and the first lower tab and extending through the upper dielectric layer.

3. The electronic device of claim 2, wherein:
the first upper tab and the first lower tab contact the shield; and
the upper dielectric layer is between the first tab via and the shield.

4. The electronic device of claim 2, wherein:
the first upper tab, the first lower tab, and the first tab via contact the shield at the first lateral side of the substrate.

5. The electronic device of claim 2, wherein:
the conductive structure comprises a second tab structure at a second lateral side of the substrate, the second tab structure contacting the shield and extending above the upper dielectric layer.

6. The electronic device of claim 2, wherein the first tab structure comprises:
a plurality of upper tabs located above the upper dielectric layer and including the first upper tab;
a plurality of lower tabs located below the upper dielectric layer and including the first lower tab; and
a plurality of tab vias located through the upper dielectric layer and including the first tab via, wherein each tab via of the plurality of tab vias is coupled between a respective one of the plurality of upper tabs and a respective one of the plurality of lower tabs.

7. The electronic device of claim 6, wherein:
the encapsulant is between a first one of the plurality of upper tabs and a second one of the plurality of upper tabs; and
the encapsulant contacts a lateral side of the first one of the plurality of upper tabs and a lateral side of the second one of the plurality of upper tabs.

8. The electronic device of claim 2, wherein the first tab structure comprises:
a plurality of upper tabs located above the upper dielectric layer and including the first upper tab; and
a plurality of tab vias located through the upper dielectric layer and including the first tab via, wherein each tab via of the plurality of tab vias is coupled between a respective one of the plurality of upper tabs and the first lower tab.

9. The electronic device of claim 8, wherein:
the encapsulant is between a first one of the plurality of upper tabs and a second one of the plurality of upper tabs; and
the encapsulant contacts a lateral side of the first one of the plurality of upper tabs and a lateral side of the second one of the plurality of upper tabs.

10. An electronic device, comprising:
a substrate comprising a conductive structure and a dielectric structure, the dielectric structure comprising an upper dielectric layer, wherein a topmost side of the upper dielectric layer defines a topmost side of the dielectric structure;
an electronic component over a top side of the substrate and coupled with the conductive structure;
an encapsulant over the top side of the substrate and adjacent a lateral side of the electronic component; and
a shield over the top side of the electronic component and contacting a lateral side of the encapsulant and a first lateral side of the substrate;
wherein the conductive structure comprises a first tab structure at the first lateral side of the substrate, wherein the first tab structure contacts the shield, wherein a topmost side of the first tab structure is below the topmost side of the upper dielectric layer, and wherein the first tab structure extends to at least a bottommost side of the upper dielectric layer.

11. The electronic device of claim 10, wherein:
the first tab structure extends continuously across the first lateral side of the substrate.

12. The electronic device of claim 10, wherein:
the first tab structure comprises a plurality of spaced apart tabs; and
the dielectric structure is between a first one of the plurality of spaced apart tabs and a second one of the plurality of spaced apart tabs.

13. The electronic device of claim 10, wherein:
a first portion of an upper side of the first tab structure is exposed from the upper dielectric layer; and the upper dielectric layer is over a second portion of the first tab structure.

14. The electronic device of claim 10, wherein:
the encapsulant comprises a skirt portion over a top side of the first tab structure and contacting a lateral side of the upper dielectric layer.

15. The electronic device of claim 10, wherein:
the first tab structure comprises a plurality of spaced apart tabs;
the encapsulant comprises a skirt portion over a top side of the plurality of spaced apart tabs; and
the skirt portion extends between a first one of the plurality of spaced apart tabs and a second one of the plurality of spaced apart tabs.

16. A method to manufacture an electronic device, comprising:
providing a substrate comprising a conductive structure and a dielectric structure, the dielectric structure comprising an upper dielectric layer, wherein a topmost side of the upper dielectric layer defines a topmost side of the dielectric structure;
providing an electronic component over a top side of the substrate and coupled with the conductive structure;
providing an encapsulant over the top side of the substrate and adjacent a lateral side of the electronic component; and
providing a shield over the top side of the electronic component and contacting a lateral side of the encapsulant and a first lateral side of the substrate;
wherein the conductive structure comprises a first tab structure at the first lateral side of the substrate, wherein the first tab structure contacts the shield, wherein a topmost side of the first tab structure extends above the topmost side of the upper dielectric layer, and wherein the first tab structure extends to at least a bottommost side of the upper dielectric layer.

17. The method of claim 16, wherein the first tab structure comprises:
a first upper tab over the upper dielectric layer;
a first lower tab under the upper dielectric layer; and
a first tab via coupled with the first upper tab and the first lower tab and extending through the upper dielectric layer.

18. The method of claim 17, wherein:
the first upper tab and the first lower tab contact the shield; and
the upper dielectric layer is between the first tab via and the shield.

19. The method of claim 17, wherein:
the first upper tab, the first lower tab, and the first tab via contact the shield at the first lateral side of the substrate.

20. The method of claim 17, wherein:
the conductive structure comprises a second tab structure at a second lateral side of the substrate, the second tab structure contacting the shield and extending above the upper dielectric layer.

\* \* \* \* \*